United States Patent

Kariatsumari

[11] 4,225,822
[45] Sep. 30, 1980

[54] AMPLITUDE MODULATION CIRCUIT FOR A TRANSMITTER

[75] Inventor: Keiichiro Kariatsumari, Inagi, Japan

[73] Assignee: Tokyo Shibaura Electric Co., Ltd., Kawasaki, Japan

[21] Appl. No.: 886,661

[22] Filed: Mar. 14, 1978

[30] Foreign Application Priority Data

Mar. 24, 1977 [JP] Japan .................................. 52-31582

[51] Int. Cl.$^2$ ........................... H04B 1/04; H03C 1/06
[52] U.S. Cl. .................................... 455/108; 179/1 F; 179/1 VL; 332/38; 455/91
[58] Field of Search ............... 332/37 D, 38; 325/150, 325/159, 182, 187; 179/1 VL, 1 F

[56] References Cited

U.S. PATENT DOCUMENTS

| | | | |
|---|---|---|---|
| 1,734,219 | 11/1929 | Lorance | 179/1 VL |
| 2,255,683 | 9/1941 | Singer | 330/123 |
| 2,312,260 | 2/1943 | Miller | 179/1 VL |
| 3,292,116 | 12/1966 | Walker et al. | 325/187 |
| 3,398,381 | 8/1968 | Torick et al. | 325/187 |
| 3,571,529 | 3/1971 | Gharib et al. | 179/1 F |

FOREIGN PATENT DOCUMENTS 46-9859  4/1971  Japan .

OTHER PUBLICATIONS

"Installation & Operating Instructions of AM citizen's Band Transceiver"—Browning Laboratories, Inc. P. 10.

Primary Examiner—Marc E. Bookbinder
Attorney, Agent, or Firm—Cushman, Darby & Cushman

[57] ABSTRACT

An amplitude modulation circuit for a transmitter has an automatic level controlled circuit (ALC circuit), including in its negative feedback loop a series circuit of a high-pass filter, a rectifier circuit and an eliminator circuit, for modulation degree suppression, thereby avoiding overmodulation. The high-pass filter is so designed that the negative feedback signal level for modulation degree suppression of the ALC circuit is raised as the audio-signal frequency supplied to the transmitter increases. In the modulation circuit having such ALC circuit, a sufficiently high mean modulation degree may be obtained without encountering overmodulation if the main spectrum components of the input audio-frequency signal are distributed in the intermediate range of the audio-signal frequency band. On the other hand, if the main spectrum components of the audio-frequency signal are distributed in the higher (high-pass) range, the upper limit of the modulation degree is restricted to a moderately lower value so as to reduce production of spurious signals. Here the ALC circuit operates so as not to change the frequency characteristic of the audio-frequency input signal but to suppress the modulation degree uniformly throughout the frequency band of the audio-frequency input signal. Therefore, the modulation circuit does not cause variation in a tone quality of the input signal.

7 Claims, 31 Drawing Figures

AMPLITUDE MODULATION CIRCUIT FOR A TRANSMITTER

BACKGROUND OF THE INVENTION

This invention relates to an amplitude modulation circuit for a transmitter in which overmodulation, as well as production of unnecessary spurious signals, is suppressed by means of an automatic level control (ALC) circuit.

In general, modulation circuits for transmitters are required to be capable of modulating a carrier to a sufficient degree with minor distortion in order to improve the signal to noise ratio (S/N ratio) and the articulation of call. Above all, when used with a radio transmitter, the modulation circuit must be minimally subject to production of spurious signals which may interfere with other frequency bands. As a modulation circuit in accordance with these requirements there has conventionally been used the following composition. That is, an input signal for modulation or audio-frequency signal (AF signal) for modulating the modulation circuit is supplied to a modulation unit through a limiter circuit or compression circuit. The limiter circuit or compression circuit has a function to prevent automatically overmodulation exceeding a modulation degree of 100%. That is, these circuits are so designed as to augment the mean transmission output by restraining overmodulation while securing sufficiently high mean modulation degree by supplying a high-level input signal for modulation to the modulation unit, thereby improving the S/N ratio.

The limiter circuit out of the aforesaid two circuits, however, has a defect to cause distortion of the modulation input signal. On the other hand, the compression circuit will hardly distort the input signal for modulation. Transmitters (transceivers) employing such compression circuit have already been proposed. Where a sufficiently high modulation degree was required, these transmitters could not satisfactorily restrain the production of spurious signals despite the use of such compression circuit, let alone the use of the limiter circuit.

The reason may be explained as follows. That is, the modulation circuit as an analog circuit is necessarily subject to non-linearity. Therefore, when the modulation input signal is supplied to the modulation circuit, the modulation circuit produces a harmonic distortion attributable to the non-linearity. The modulated wave or transmitted radio wave involving the harmonic distortion includes spurious components attributable to the harmonic distortion, besides the frequency components of the carrier. That is, the level of spurious signals is chiefly attributable to the non-linearity of the modulation circuit used with the transmitter. Generally, the higher the modulation degree as well as the frequency of the modulation signal, the more remarkable the non-linearity is. Therefore, in the transmitter provided with the prior art modulation circuit, the modulation degree with respect to the whole range of the frequency band of the AF signal used as the modulation input signal is restricted to a somewhat lower level in order to restrain the production of spurious signals. Thus, the prior art transmitter is so devised that any spurious signals exceeding a level prescribed by the specifications of the transmitter will not be caused outside the occupied band thereof if a modulation input signal having many higher range frequency components within the audio-frequency band is supplied to the modulation circuit.

Further, in the transmitter including the conventional modulation circuit, a voltage controlled oscillator (VCO) in a frequency synthesizer circuit to produce the carrier and a radio-frequency amplifying circuit to amplify the carrier are securely shielded in order to avoid the modulation distortion attributable to unfavorable connections among the circuits within the transmitter.

The defects of the transmitter employing the prior art modulation circuit, as described above, may be summarized as follows. Since the production of spurious signals must be restrained, the performance primarily required for a transmitter, i.e. high mean modulation degree, cannot be secured. Moreover, in order to restrain the production of spurious signals, the transmitter requires well-selected, high-performance circuit elements as well as a number of components for shielding. Furthermore, in order to make the most of the performance of the transmitter within the range of modulation degree limited so as to bring the production of spurious signals in compliance with the specifications, many adjusting processes will be required for the transmitter. Accordingly, such type of transmitter cannot help being highly expensive.

SUMMARY OF THE INVENTION

An object of this invention is to provide an amplitude modulation circuit for a transmitter capable of reducing overmodulation, modulation distortion, and production of spurious signals after securing a high mean modulation degree.

In order to attain the above object, the modulation circuit according to the invention comprises a gain controlled amplifier circuit for amplifying an input audio-frequency signal to provide a modulation signal, the amplification degree of the circuit being negative-feedback-controlled by an automatic level control signal; a filter circuit for filtering the high-pass frequency components out of the modulation signal so as relatively to augment the amplitude of the higher range frequency components of the modulation signal; a rectifier circuit for rectifying the output signal of the filter circuit to provide a DC component proportional to the amplitude of the modulation signal; an eliminator circuit for eliminating ripples from the output signal of the rectifier circuit to provide the automatic level control signal converted into a direct current; a modulation unit for amplitude-modulating an input carrier to produce a modulated radio-frequency signal for transmission, the modulation degree of the unit being controlled by the modulation signal; and a frequency synthesizer circuit for synthesizing a radio-frequency signal equivalent to the transmission frequency to provide the carrier.

In the transmitter with the above construction, uniform modulation throughout the frequency band of the modulation signal may be achieved when the modulation signal level is relatively low. Meanwhile, even though the modulation signal level is raised, any overmodulation will not be caused and a sufficiently high mean modulation degree will be provided if the main amplitude components of the modulation signal are distributed in the intermediate range of the frequency band. On the other hand, if the main amplitude components of the modulation signal are distributed in the higher range of the frequency band, then the upper limit of the modulation degree will be restricted to a moderately lower level so that the level of the unnecessary spurious signals as produced becomes lower than the level prescribed by the specification. Thus, the transmitter provided with the modulation circuit of the invention, subject to less modulation distortion and production of spurious signals, may securely prevent overmodulation, thereby producing radio waves with sufficiently high mean modulation degree with respect to the intermediate range, i.e. the essential band of the spectrum distribution of a human voice.

DETAILED DESCRIPTION OF THE PREFERRED EMBODIMENTS

Figure 1:
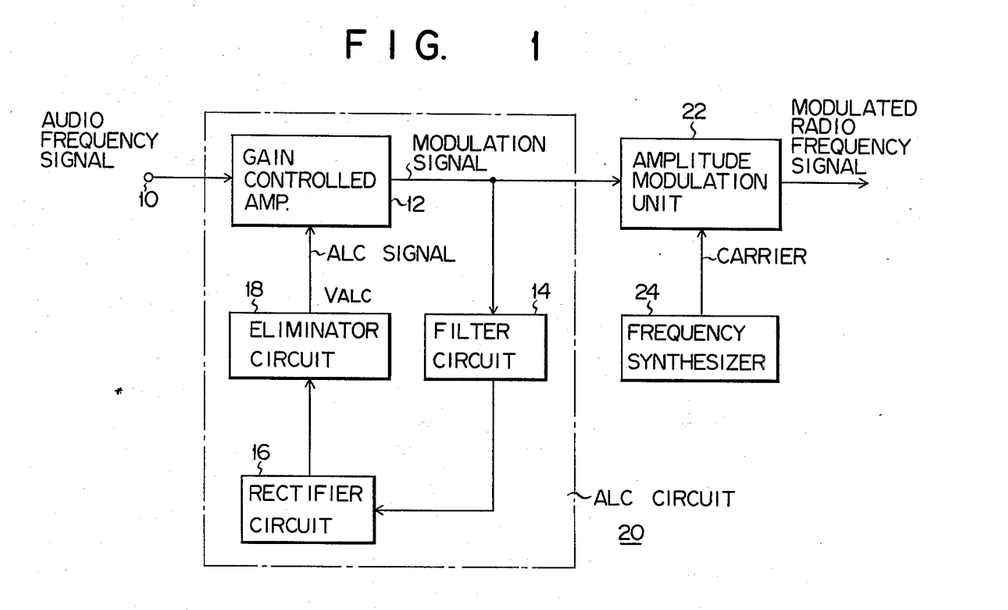
FIG. 1 is a block diagram showing the fundamental composition of a modulation circuit according to this invention.

Illustrative embodiments of this invention will now be described with reference to FIGS. 1 to 31, in which like reference numerals refer to the same parts throughout the several views. FIG. 1 is a block diagram showing the fundamental composition of an amplitude modulation circuit for a transmitter according to this invention. That is, an audio-frequency signal given to an input terminal 10 is applied to the input of a gain controlled amplifier circuit (GCA) 12. Part of a modulation signal produced from the GCA 12 is applied to the input of a filter circuit 14. The filter circuit 14 is provided for giving the selectivity for frequency to the modulation degree suppressing property of the modulation circuit. The output signal of the filter circuit 14 is applied to the input of a rectifier circuit 16, where it is rectified. A pulsating DC signal produced from the rectifier circuit 16 is supplied to an eliminator circuit 18. The eliminator circuit 18 is intended for providing a substantially entire DC signal by removing the ripple of the supplied pulsating DC signal. The DC signal produced from the eliminator circuit 18 is delivered to the GCA 12 as an automatic level control (ALC) signal. The gain of the GCA 12 is subject to negative feedback control by the ALC signal. Namely, the gain of the GCA 12 is inversely proportional to the voltage $V_{ALC}$ of the ALC signal.

Thus, the GCA 12 forms an ALC circuit 20 including in its negative feedback loop the filter circuit 14, rectifier circuit 16 and eliminator circuit 18 connected in series. That is, when the amplitude of the AF signal supplied to the ALC circuit 20 is narrow, the gain of the GCA 12 is large. On the other hand, when the amplitude of the supplied AF signal is wide, the gain of the GCA 12 is small. Here it is to be noted that the transmission frequency response of the GCA 12 would never change with the level of the voltage $V_{ALC}$. The gain is the only characteristic of the GCA 12 that may be changed according to the voltage $V_{ALC}$.

Meanwhile, included in the negative feedback loop of the ALC circuit 20 is the filter circuit 14. Let us assume that the filter circuit 14 is a high-pass filter, for example. Thereupon, if the amplitude of the output signal or modulation signal of the GCA 12 is supposed to be constant, the voltage $V_{ALC}$ increases as the frequency of the signal supplied to the ALC circuit 20 becomes higher. In other words, although the mean level of the AF signal supplied to the ALC circuit 20 throughout the frequency band is the same, the gain of the GCA 12 will be relatively increased if the main amplitude (spectrum) components is distributed in the middle or lower range of the frequency band, whereas the gain of the GCA 12 will be relatively reduced if the main amplitude components are distributed in the higher range of the band. More plainly, it may be explained as follows. That is, even though with the same sound volume supplied, the modulation signal level is raised if a cello sound is applied to the input, while the modulation signal level is lowered if a violin sound is applied to the input.

The output or modulation signal of the ALC circuit 20 with the aforementioned construction is supplied to an amplitude modulation unit 22. This amplitude modulation unit 22 is further provided with a carrier delivered from a frequency synthesizer 24. In the amplitude modulation unit 22, the carrier is modulated by means of the modulation signal, and converted into a modulated radio-frequency signal (RF signal) for transmission, which is led to an antenna (not shown) and radiated in the air.

Generally speaking, the operation of thus constructed amplitude modulation circuit is as follows. That is, if the amplitude of the input AF signal is narrow, the modulation will be conducted to a depth in proportion to the AF signal level without regard to the frequency distribution of the amplitude. Meanwhile, if an AF signal with a wide amplitude which is mainly formed of frequency components attenuated by the filter circuit 14 is applied to the input, then a deep modulation in proportion to the AF signal level will be achieved. There will not, however, be achieved any over-modulation exceeding a degree of 100% because of the modulated signal level suppression by the ALC circuit 20. On the other hand, if an AF signal with a wide amplitude which is mainly formed of frequency components not attenuated by the filter circuit 14 is applied to the input, then the modulation will be conducted to a shallower degree than the depth proportional to the AF signal level. Let us suppose that the frequency characteristic of the filter circuit 14 is such that the amplitude response to frequency components at 400 Hz is 3 dB lower than that at 2.5 KHz. Here, if the modulation circuit is so adjusted that at most 100% modulation may be conducted for a sine-wave input at 10 mV (rms) and 400 Hz, the modulation degree for the sine-wave input at 10 mV (rms) and 2.5 KHz will be restricted to the maximum degree of approximately 70%. Naturally, the maximum modulation degree for the input at 400 Hz may be adjusted at 100% or any level lower than 100%.

As has been described above, in this modulation circuit, the upper limit of the modulation degree is restricted more as the frequency components of the amplitude of the input AF signal are distributed more in the band not attenuated by the filter circuit 14. Therefore, if the filter circuit 14 is a high-pass filter or band-rejection filter for the intermediate range, for example, the higher the main components of the AF input, the more the upper limit of the modulation degree is restricted. That is, especially suppressed is the large modulation with respect to the AF input of high frequency components that is the main cause of the production of spurious signals, so that the transmitter including this modulation circuit is subject to production of less spurious signals. Moreover, since fully deep modulation may be effected with respect to the intermediate range which is the main frequency band of the AF signal, the average transmission power of the transmitter can be increased to a sufficiently high-level. Further, overmodulation exceeding 100% may securely be avoided, thus reducing the modulation distortion.

Thus, according to the transmitter including the modulation circuit of the invention, substantially distortion-free radio communication can be achieved with improved S/N ratio as well as with reduced spurious disturbance.

Figure 2:
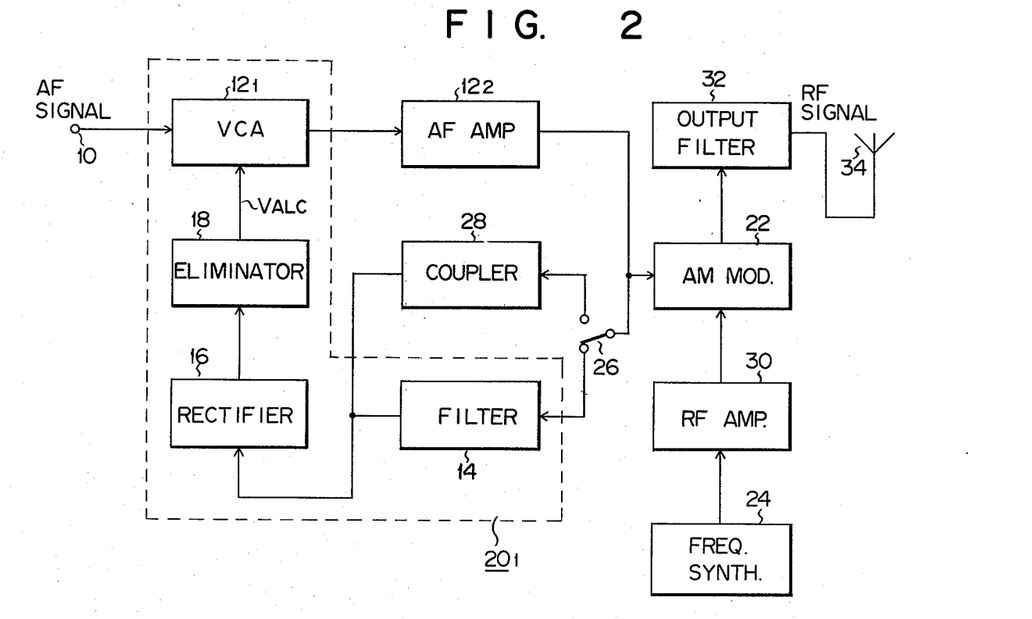
FIG. 2 is a block diagram showing a further definite example of the composition in accordance with the composition of FIG. 1.

FIG. 2 shows an example of practical composition rearranged from the fundamental composition as shown in FIG. 1. That is, the AF signal applied to the input terminal 10 is supplied to a voltage controlled attenuator (VCA) $12_1$. The output signal of the VCA $12_1$ is applied to the input of an audio-frequency amplifier $12_2$, whose output signal is used as a modulation signal. Part of the modulation signal is supplied to either the filter circuit 14 or a coupler circuit 28 by means of a changeover switch 26. When the switch 26 is on the side of the filter circuit 14, the part of the modulation signal is converted into an ALC signal by means of the filter circuit 14, rectifier circuit 16 and eliminator circuit 18. The attenuation of the VCA $12_1$ may be varied according to the DC voltage level $V_{ALC}$ of the ALC signal. Thus, there is formed an ALC circuit $20_1$. It may easily be understood that the ALC circuit $20_1$ of FIG. 2 is substantially the same as the ALC circuit 20 of FIG. 1 by identifying the series circuit of the VCA $12_1$ and audio-frequency amplifier $12_2$ of FIG. 2 with the GCA 12 of FIG. 1.

Meanwhile, when the switch 26 selects the coupler circuit 28, the filter circuit 14 is replaced by the coupler circuit 28. In this case, the modulation circuit including the ALC circuit operates in the same manner as the modulation circuit employing the prior art compression circuit. That is, in the composition of FIG. 2, the transmission performance may be switched optionally by selecting the coupler circuit 28 when the modulation is required to be conducted deep into the higher range components of the AF input in spite of an increase in production of spurious signals and selecting the filter circuit 14 when the production of spurious signals is to be checked.

The modulated signal of the modulation circuit used for a carrier which is synthesized by a frequency synthesizer 24 and amplified to a predetermined level by a radio-frequency amplifier 30. This carrier is amplitude-modulated in the modulation unit 22 by means of the modulation signal from the audio-frequency amplifier $12_2$. The modulated RF signal modulated by the modulation unit 22 is led to an antenna 34 through an output filter circuit 32, and radiated in the air.

Figure 3:
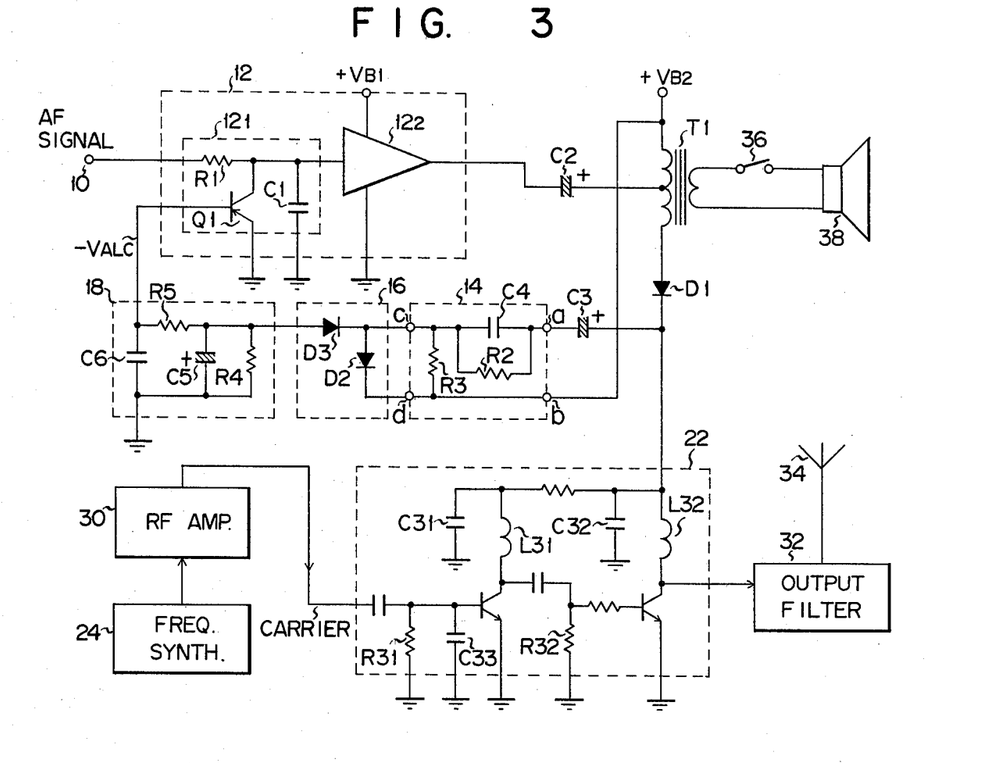
FIG. 3 is a circuit diagram showing an embodiment of the modulation circuit of the invention in accordance with the composition of FIG. 2.

FIG. 3 shows a further definite example of circuit in accordance with the composition as shown in FIG. 2. In FIG. 3, however, the switch 26 and coupler circuit 28 are omitted, whereas a speaker circuit is added instead thereof. In FIG. 3, the AF signal applied to the input terminal 10 is supplied to the audio-frequency amplifier $12_2$ through a resistor $R_1$. Separately connected between the input terminal of the amplifier $12_2$ and the ground line are the collector and emitter terminals of a PNP transistor $Q_1$ for control and a compensation capacitor $C_1$. That is, the VCA $12_1$ is formed of a voltage divider circuit including the resistor $R_1$, transistor $Q_1$ and capacitor $C_1$. While the attenuation ratio of the VCA $12_1$ is low when the base current of the transistor $Q_1$ is little, it increases as the base current of the transistor $Q_1$ is increased. Namely, the transistor $Q_1$ is a variable resistance or rheostat controlled by the base current. The compensation capacitor $C_1$ is connected mainly for the purpose of reducing an operations distortion due to the non-linear voltage variation in the output capacity $C_{0b}$ of the transistor $Q_1$. Thus, the modulation distortion, as well as the spurious emission, may be reduced. However, the modulation frequency characteristic will be adversely affected if the capacity of the capacitor $C_1$ is excessively increased, so that it is not advisable to restrain the production of spurious signals by increasing the capacity of the capacitor $C_1$. Further, the amplifier $12_2$ is supplied from a first power source $+V_{B1}$. The VCA $12_1$ and amplifier $12_2$ form the GCA 12.

The output terminal of the amplifier $12_2$ is connected to the primary tap (usually, center tap) of an output transformer $T_1$ through an output capacitor $C_2$, while the secondary side of the transformer $T_1$ is connected with a speaker 38 through a switch 36. That is, when the switch 36 is closed at time of transmission, the transmitted sound is monitored. When the switch 36 is closed at reception, sound play-back of the received radio wave is performed. One end on the primary side of the transformer $T_1$ is supplied from a second power source, while the other end on the primary side of the transformer $T_1$ is connected to the anode of a switch diode $D_1$. Whereas the diode $D_1$ conducts when its anode potential is higher than the cathode potential, it is cut off when the anode potential is lower than the cathode potential. Therefore, the diode $D_1$ functions as a switch. The diode $D_1$ is so biased as to be cut off at reception and to conduct at transmission. The cathode of the diode $D_1$ is connected to a first terminal a of the filter circuit 14 through a capacitor $C_3$. A second input terminal b of the filter circuit 14 is connected with the second power source $+V_{B2}$. Connected between the first input terminal a and a first output terminal c is a parallel circuit of a capacitor $C_4$ and a resistor $R_2$. Further, the second input terminal and a second output terminal d of the filter circuit 14 are directly connected with each other, and a resistor $R_3$ is connected in a circuit arranged between the first output terminal c and the second output terminal d. Thus, the filter circuit 14 forms a kind of high-pass filter. Connected between the first output terminal c and the second output terminal d are the anode and cathode of a rectifying diode $D_2$. The anode of the diode $D_2$ is connected with the cathode of a rectifying diode $D_3$. The rectifier circuit 16 formed of the diodes $D_2$ and $D_3$ is a half-wave voltage doubler rectifier circuit to provide a negative rectifying output. The anode of the diode $D_3$ is connected to the junction of the respective one-side ends of resistors $R_4$ and $R_5$. The other end of the resistor $R_4$ is connected to the ground line. The resistor $R_4$ is connected in parallel with an elimination capacitor $C_5$. Connected between the other end of the resistor $R_5$ and the ground line is a filter capacitor $C_6$. The resistors $R_4$ and $R_5$ and the capacitors $C_5$ and $C_6$ form the eliminator circuit 18. Depending on the selection of the time constants of these capacitors and resistors forming the eliminator circuit 18, the ALC operation may be conducted in response to either the peak value of the AF signal input, or the mean value of the AF signal input, or the intermediate value between the peak and mean values. It is to be understood that the ALC operation may be conducted in accordance with RMS value detection. The output terminal of the eliminator circuit 18, i.e. the junction of the resistor $R_5$ and capacitor $C_6$, is connected to the base of the control transistor $Q_1$ of the VCA $12_1$. Thus formed is the ALC circuit 20.

The modulation signal taken out from the junction of the cathode of the diode $D_1$ and the capacitor $C_3$ is convoluted by the direct current from the second power source $+V_{B2}$, and supplied to the power supply input terminal of the modulation unit 22. If the supply voltage $+V_{B2}$ is 13.9 V, the convoluted modulation signal is practically available at approximately $\pm 6.3$ V, for example, with the modulation degree of 100%. That is, the modulation unit 22 is a collector modulation type amplitude modulator in which the amplitude modulation is achieved at the supply voltage level. The modulation unit 22 is supplied with a carrier as a modulated wave that has been synthesized by the frequency synthesizer 24 and adjusted to a proper level by the radio-frequency amplifier 30. Further, the output signal of the modulation unit 22 is supplied to the antenna 34 through the output filter circuit 32. In the circuit of the modulation unit 22, the coils $L_{31}$ and $L_{32}$ and the capacitors $C_{31}$ and $C_{32}$ are intended for carrier excitation. Moreover, the capacitor $C_{33}$ is used for impedance matching, while the resistors $R_{31}$ and $R_{32}$ are used for bias resistances.

Figure 4:
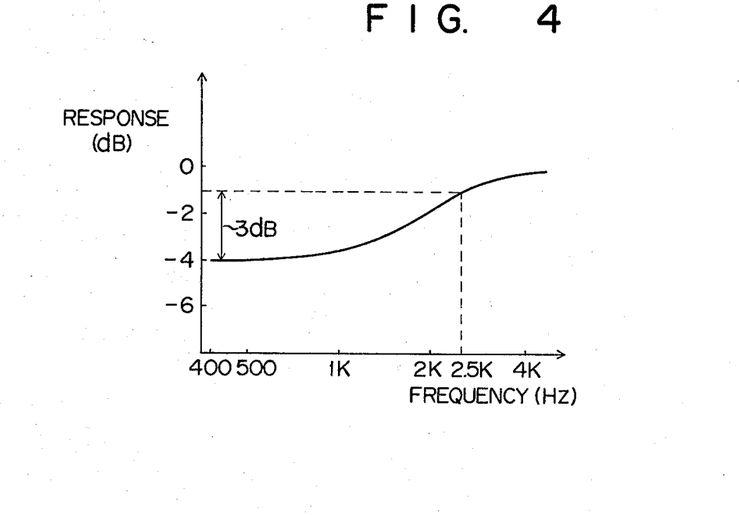
FIG. 4 is a graph showing an example of the frequency response of a filter circuit included in the circuit of FIG. 3.

Let us suppose that the filter circuit 14, among other circuits as aforementioned, is formed of CR with the constants given as follows: $R_2 = 15$ K$\Omega$, $R_3 = 10$ K$\Omega$ and $C_4 = 0.0068$ $\mu$F. Whereas the transfer frequency response of the filter circuit 14 somewhat varies with the impedances of the circuits connected with the input and output terminals, the frequency response of the filter circuit 14 formed of the CR with the above constants varies substantially as shown in FIG. 4. The operation of the ALC circuit including the filter circuit 14 with such characteristic may be described as follows.

The AF signal applied to the input terminal 10, after attenuated by the VCA $12_1$, is amplified into a modulation signal by the amplifier $12_2$. The diode $D_1$ is allowed to conduct while the modulation circuit is engaged in the transmitting operation. Accordingly, the modulation signal offered by the amplifier $12_2$ is applied to the input terminals a and b of the filter circuit 14 through the capacitor $C_2$, transformer $T_1$, diode $D_1$ and capacitor $C_3$. The modulation signal subjected to frequency selection by the filter circuit 14 is converted into a negative pulsating direct current by the rectifier circuit 16. This negative pulsating direct current is converted into a substantially ripple-free direct current, i.e. negative ALC signal, by the eliminator circuit 18. The negative ALC signal is given as a negative feedback signal to the base of the control transistor $Q_1$ of the VCA $12_1$. Thereupon, the attenuation by the VCA $12_1$ increases, and the amplitude of the modulation signal is automatically adjusted to a fixed level. That is, the ALC circuit may be so adjusted that the modulation circuit may not perform overmodulation exceeding a degree of 100% for a 400 Hz sine-wave AF signal. Let it be supposed that a 2.5 KHz sine-wave AF signal with the same amplitude as that of the 400 Hz AF signal at 100% modulation is applied to the input of the modulation circuit adjusted in the aforesaid manner. Hereupon, as may be clear from the characteristic curve of FIG. 4, the level of the ALC signal supplied to the control transistor $Q_1$ of the VCA $12_1$ increases by 3 dB. The attenuation at the VCA $12_1$ is substantially in inverse proportion to the level of the ALC signal. Therefore, if the 2.5 KHz single tone is applied to the input as aforesaid, the amplitude of the output or modulation signal of the amplifier $12_2$ decreases by nearly 3 dB. Thus, the maximum modulation at 2.5 KHz may be restricted to about 70%. Accordingly, with the frequency of the AF input signal taken as a parameter, the relation between the AF input signal and modulation degree of the modulation circuit may be given by the curves as shown in FIG. 5.

Figure 5:
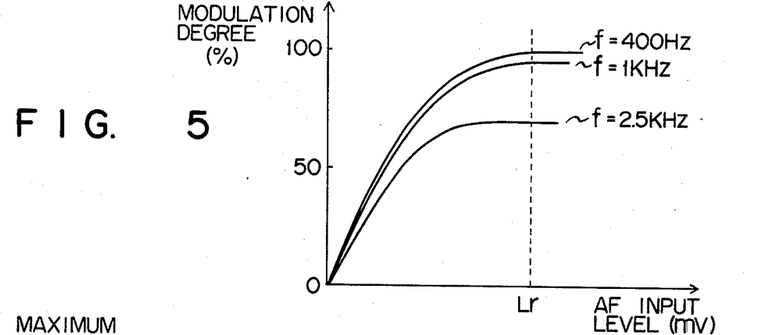
FIGS. 5 and 6 are graphs showing the modulation degree characteristics of the modulation circuit of the invention where the filter circuit with the characteristics as shown in FIG. 4 is used.
Figure 6:
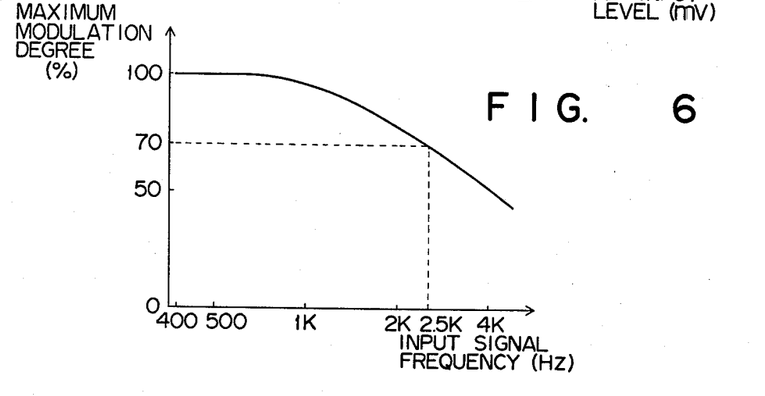

FIG. 5 is a graph illustrating a case in which the AF signal level is selected as a variable, while if the AF signal level is fixed at a value indicated by "Lr" in FIG. 5, for example and the frequency of the AF signal is taken as the variable, a curve of FIG. 6 may be obtained. That is, the maximum modulation degree is reduced as the frequency of the AF input signal increases. Here it is surely to be noted that FIG. 6 shows by no means the frequency characteristic of the normal modulation degree, but shows the frequency characteristic of the maximum modulation degree. Therefore, the modulation circuit would not operate in such a manner as relatively to reduce the high-frequency range of the input AF signal.

Figure 7:
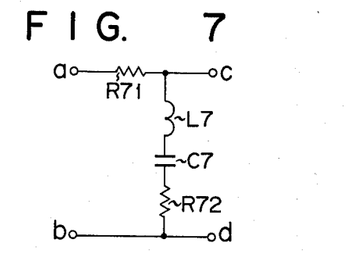
FIGS. 7 to 15 show examples of the circuit applicable to the filter circuit for the modulation circuit of the invention.
Figure 8:
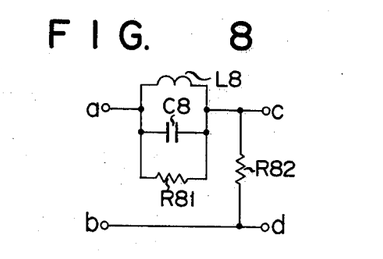
Figure 9:
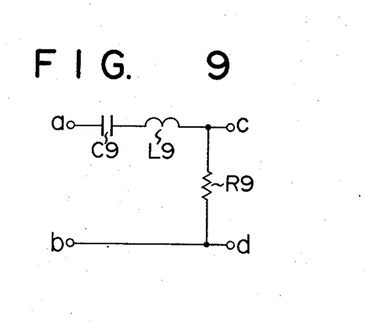
Figure 10:
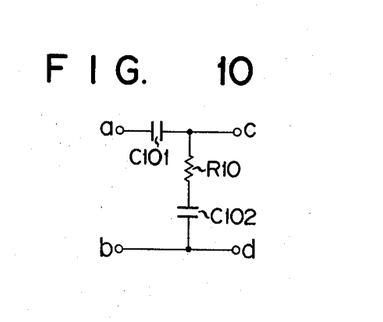
Figure 11:
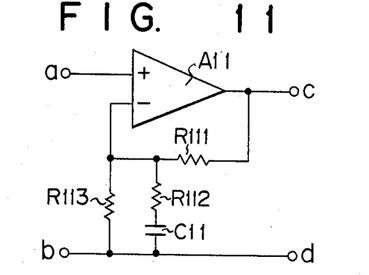
Figure 12:
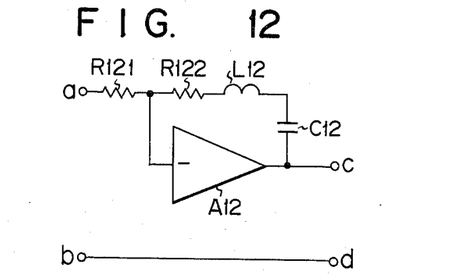
Figure 13:
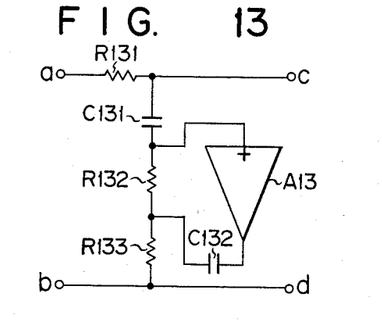
Figure 14:
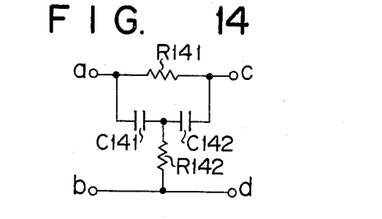
Figure 15:
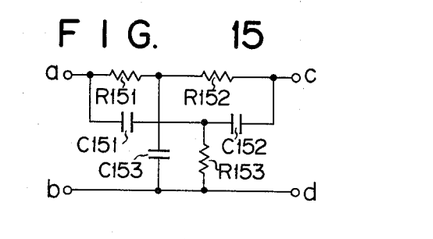

Although a kind of high-pass filter is used for the filter circuit 14 in the embodiment of FIG. 3, a band-pass filter or band-rejection filter may also be used for the filter circuit 14. What is essential is only that the filter be one which may relatively enlarge the high-frequency range including few large-amplitude components and causing spurious signals as compared with the intermediate range which is the main band of the amplitude distribution of a human voice (AF signal input). FIGS. 7 to 15 show examples of the circuit available for the filter circuit 14. Among the circuits of these drawings that of FIG. 11 functions as a kind of high-pass filter, whereas that of FIG. 9 functions as a kind of band-pass filter. On the other hand, the circuits of FIGS. 7, 8, 10 and 12 to 15 are kinds of band-rejection filter. Those of FIGS. 7 and 8 are LC-type passive filters, while those of FIGS. 10, 14 and 15 are CR-type passive filters. FIG. 12 shows an active filter including an LC circuit in the negative feedback loop of a phase-inverted amplifier. Further, FIG. 13 shows an example of the band-rejection filter taking advantage of the frequency selectivity of a bootstrap circuit formed of a phase-noninverted amplifier $A_{13}$, capacitor $C_{132}$ and resistors $R_{132}$ and $R_{133}$, and a capacitor $C_{131}$. Available for the amplifier $A_{13}$ is an emitter follower circuit with the amplification degree of +1. Such bootstrap circuit is the one used as a semiconductor inductance.

Figure 16:
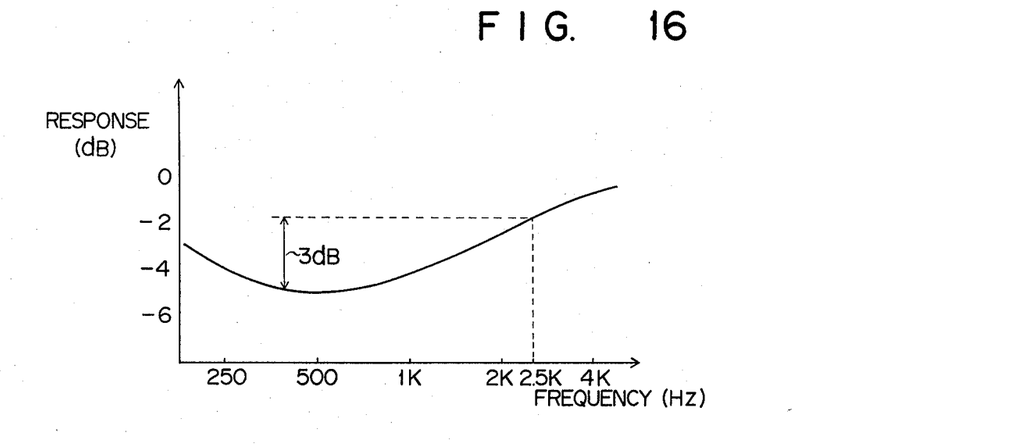
FIG. 16 is a graph showing an example of the frequency response where a band-rejection filter is used for the filter circuit according to the invention.
Figure 17:
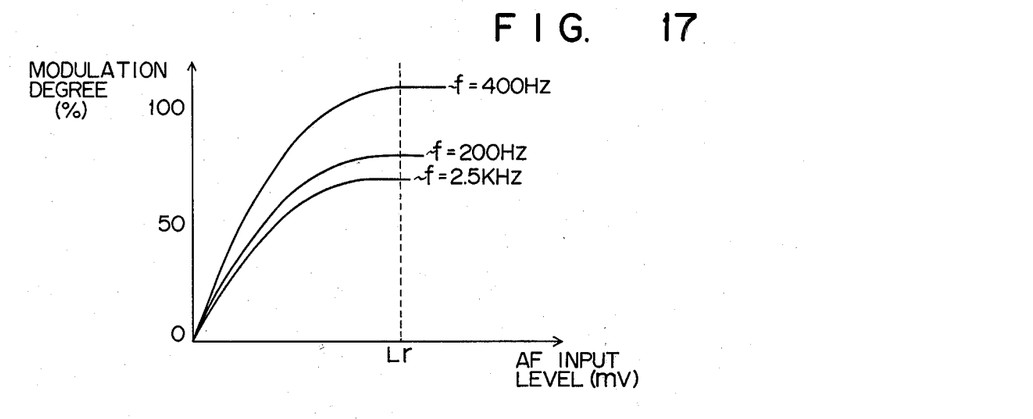
FIGS. 17 and 18 are graphs showing the modulation degree characteristics of the modulation circuit of the invention where the filter circuit with the characteristic as shown in FIG. 16 is used.
Figure 18:
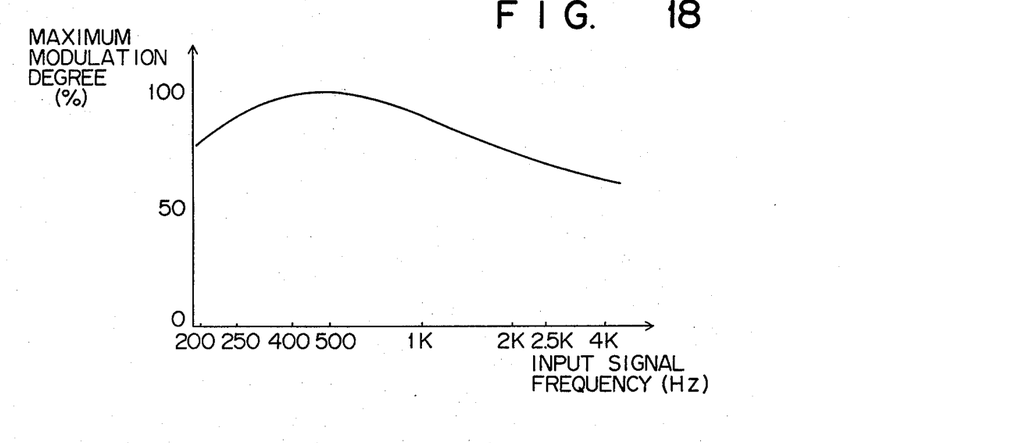

By way of example, let use assume a case where the circuit of FIG. 7 among other band-rejection filters as aforesaid is applied to the filter circuit 14 of FIG. 3. If $R_{71}=1$ K•, $L_7=33$ mH, $C_7=1$ μf and $R_{72}=180$ Ω in FIG. 7, then FIGS. 16 and 17 may be obtained like the case with FIGS. 4 to 6. That is, if the band-rejection filter is used for the filter circuit 14, the maximum modulation degree with respect to the lower range of the AF input, as well as to the higher range, may be restrained. On the other hand, if the band-pass filter is used for the filter circuit 14, then the maximum modulation degree with respect to the frequency band (higher range) made relatively larger by means of the filter will specially be suppressed.

Figure 19:
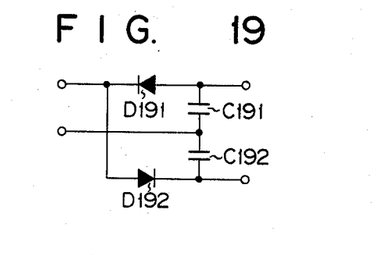
FIGS. 19 to 21 show examples of the circuit applicable to a rectifier circuit for the modulation circuit of the invention.
Figure 20:
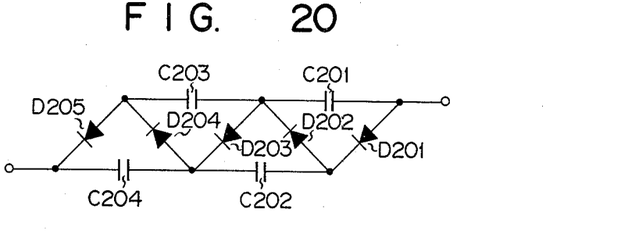
Figure 21:
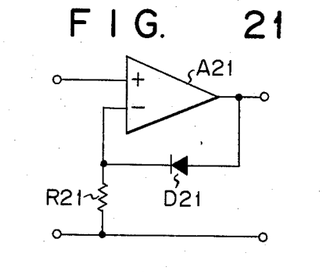
Figure 22:
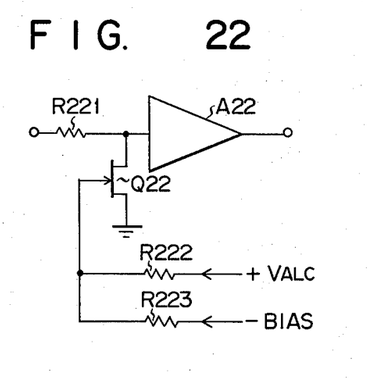
FIGS. 22 to 27 show examples of the circuit applicable to a gain controlled amplifier circuit for the modulation circuit of the invention.

Although the half-wave voltage doubler rectifier circuit is used for the rectifier circuit 16 in the embodiment of FIG. 3, it is to be understood that any other suitable circuits may be also available for this purpose. Whereas a simple half-wave rectifier circuit with a single diode may be used for the rectifier circuit 16, there may be employed such a full-wave voltage doubler rectifier circuit as shown in FIG. 19 when the input and output sides of the rectifier circuit are entirely separate from each other for the sake of circuit design, for example. Alternatively, there may be also used a multistage rectifier (Cockcroft-Walton circuit) as shown in FIG. 20. Further, also available is a linear rectifier circuit with a diode in the negative feedback loop of an amplifier $A_{21}$, as shown in FIG. 21.

As for the GCA 12, it may be selected from those shown in FIGS. 22 to 27. Among the circuits in these drawings those of FIGS. 22 to 24 employ e.g. an N-channel junction FET as a control transistor, controlling the internal resistance of the FET by means of the ALC signal voltage $V_{ALC}$. On the other hand, the circuits of FIGS. 25 to 27 employ instead of the control transistor a photo coupler including a light-emission diode or lamp.

Figure 28:
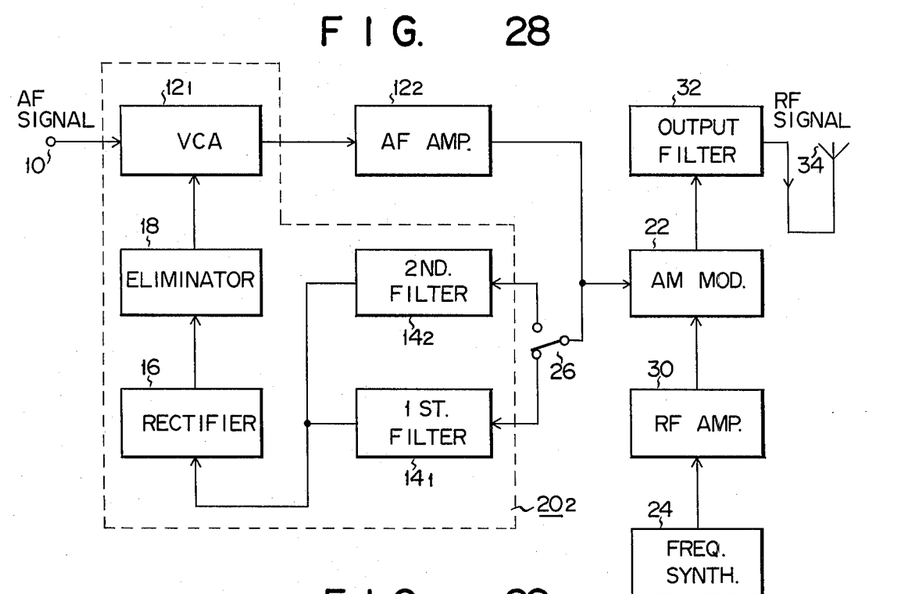
FIGS. 28 to 30 are block diagrams showing alternative embodiments of the modulation circuit according to the invention.

FIG. 28 shows a modification of the modulation circuit as shown in FIG. 2. That is, the ALC circuit $20_2$ of FIG. 28 includes a first filter circuit $14_1$ and a second filter circuit $14_2$, these filter circuits being optionally selected by means of the switch 26. If the characteristics of the first and second filter circuits $14_1$ and $14_2$ are varied from each other, different ALC operations may be optionally selected according to the kinds of AF input.

Figure 29:
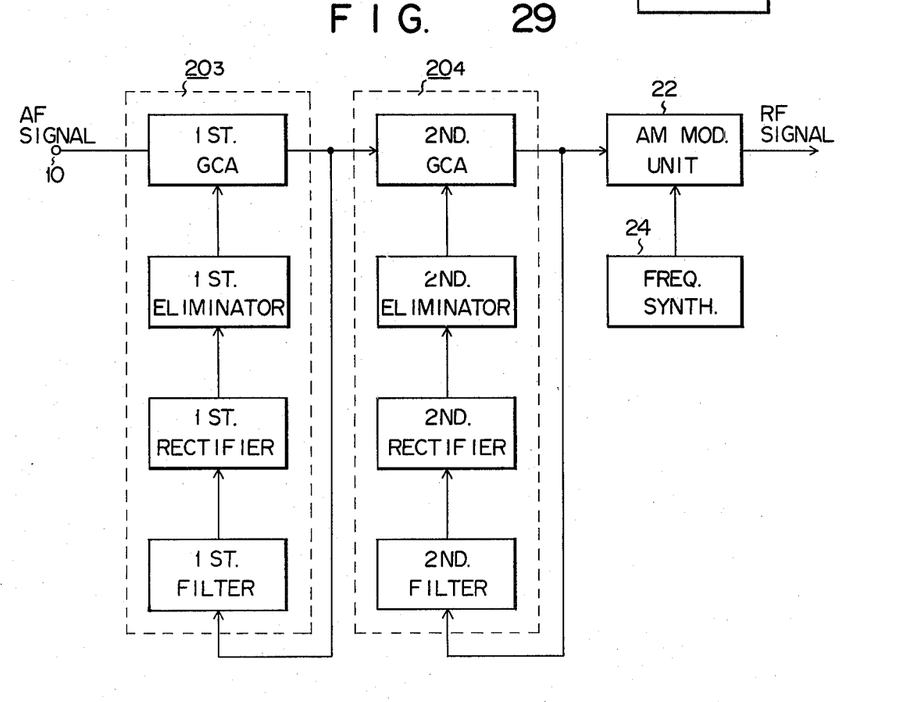

FIG. 29 is another modification of the circuit of FIG. 1 (or FIG. 2). Thus, by connecting entirely independent two systems of ALC circuit in series, the modulation circuit may be given the following function, for example. That is, a first ALC circuit $20_3$ includes a band-pass filter for a specific frequency $f_1$ which may effectively restrain the maximum modulation degree when the AF input of the frequency component $f_1$ is supplied at a high level. On the other hand, a second ALC circuit $20_4$ includes a high-pass filter to allow a specified frequency $f_2$ or higher to pass, effectively restraining the maximum modulation degree when the AF input of the frequency component $f_2$ or higher is supplied at a high level. Not changing the frequency characteristic of the AF input signal, both the first and second ALC circuit $20_3$ and $20_4$ may operate quite independently according to the characteristics of their own filter circuits.

Figure 30:
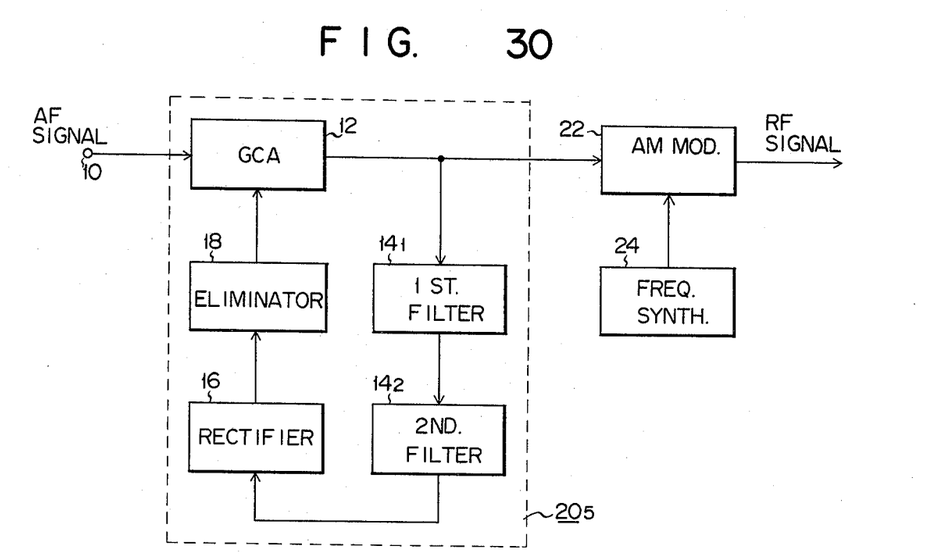

FIG. 30 shows still another modification of the circuit of FIG. 1 (or FIG. 2). The ALC circuit $20_5$ as shown in FIG. 30 includes the filter circuits $14_1$ and $14_2$. A wide variety of ALC characteristics may be obtained by combining these filter circuits at need with the various filter circuits as shown in FIGS. 3 and 7 to 15, or by employing filter elements with varied constants for similar filter circuits.

Figure 23:
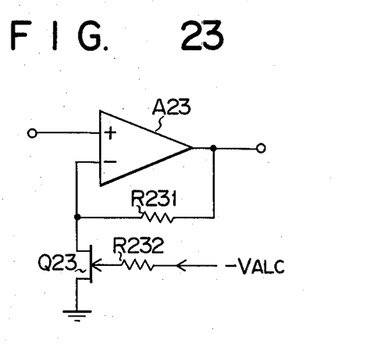
Figure 24:
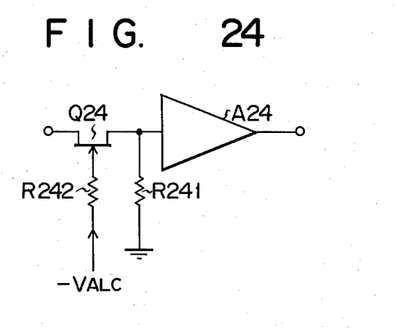
Figure 25:
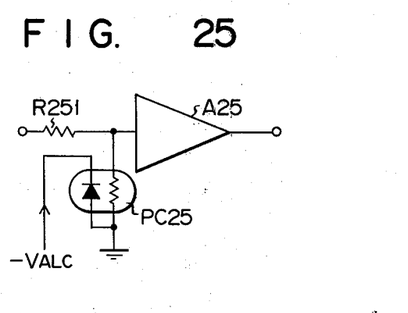
Figure 26:
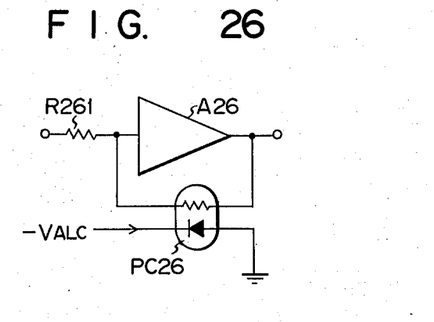
Figure 27:
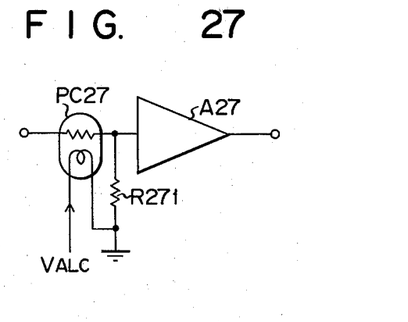
Figure 31:
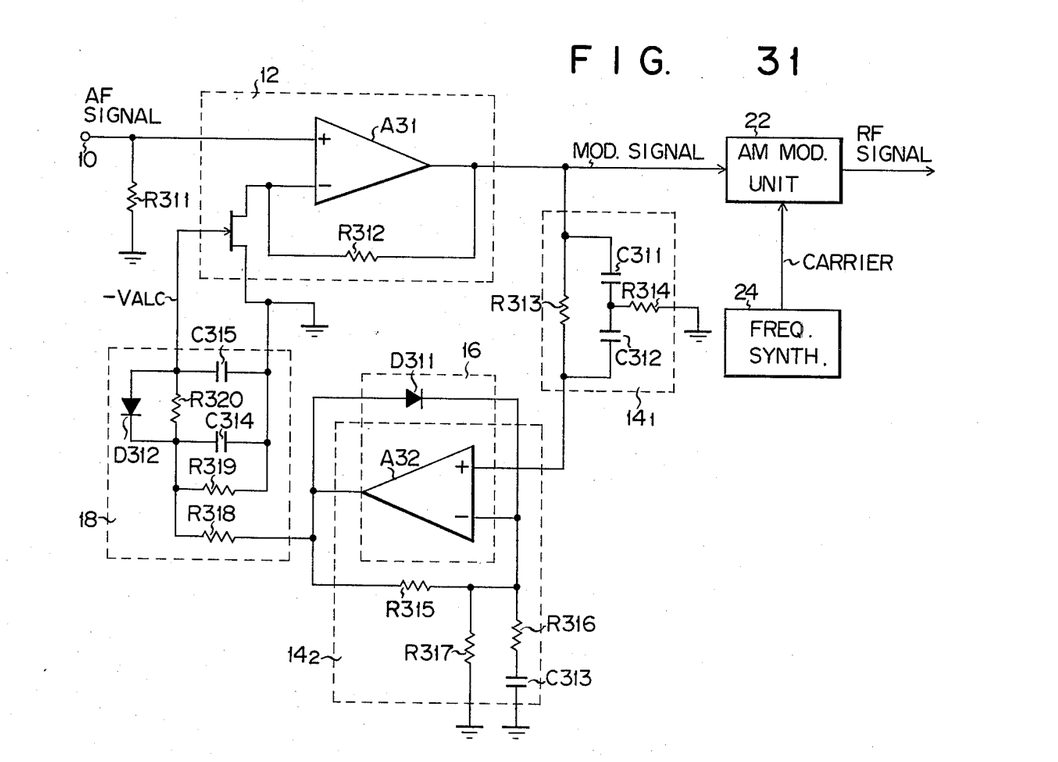
FIG. 31 is a circuit diagram showing a further definite composition in accordance with the composition of FIG. 30.

FIG. 31 shows a further definite example of the circuit in accordance with the composition of FIG. 30. In this composition the circuit as shown in FIG. 23 is used for the GCA 12. Used for the first filter circuit $14_1$ is a bridged T-type band-rejection filter as shown in FIG. 14. For the second filter circuit $14_2$ there is employed a high-pass filter as shown in FIG. 11. A half-wave linear rectifier circuit as shown in FIG. 21 is used for the rectifier circuit 16, including the amplifier $A_{32}$ of the second filter circuit $14_2$. Further, the eliminator circuit 18 includes a General-use π-shaped CR low-pass filter. Here the function of a diode $D_{312}$ connected in parallel with a resistance $R_{320}$ will be described. When the eliminator circuit 18 is supplied with a negative voltage from the rectifier circuit 16, the diode $D_{312}$ is forwardly biased unless a capacitor $C_{315}$ is fully charged. Thereupon, the capacitor $C_{315}$ is charged quickly, and the ALC signal voltage $-V_{ALC}$ may increase to a predetermined level in a short time. On the other hand, when the charge on the capacitor $C_{315}$ is discharged, the diode $D_{312}$ is inversely biased. Thus, the time constant of discharge of the charge on the capacitor $C_{315}$ increases, so that the reduction in the ALC signal voltage $-V_{ALC}$ becomes slower. That is, by using such eliminator circuit, the ALC operation may be quickly started and slowly stopped, thereby reducing the unnaturalness caused by the ALC operation, i.e., the unevenness of the level of the transmitted AF signal.

Thus, according to transmitter provided with the amplitude modulation circuit of this invention, the overmodulation may securely be avoided, and the modulation distortion, as well as the production of spurious signals, may substantially be reduced. Accordingly, the troublesome measure to counter the spurious emission that has conventionally been taken with difficulties may be simplified, thus reducing the cost of production.

Although a specific circuit has been illustrated and described herein, it is not intended that the invention be limited to the elements and circuit arrangements disclosed herein. One skilled in the art will recognize the particular elements or subcircuits may be used without departing from the spirit of the invention.

What is claimed is:

1. An amplitude modulation circuit for a transmitter, comprising:
  (a) gain controlled amplifier means for amplifying an input audio-frequency signal to produce a modulation signal, the amplification gain of said gain controlled amplifier means being negative-feedback-controlled by an automatic level control signal;
  (b) filter means for producing a filtered modulation signal from said modulation signal, the relative gain of said filter means in response to a signal of approximately 2.5 kHz being approximately 3 dB greater than the relative gain of said filter means in response to a signal of approximately 400 Hz;

(c) rectifier means for rectifying the output signal of said filter circuit in order to provide a DC component proportional to the amplitude of said filtered modulation signal;

(d) eliminator means for eliminating ripples from the output signal of said rectifier means in order to provide said automatic level control signal converted into a direct current;

(e) modulation means for amplitude-modulating an input carrier in order to produce a modulated radio-frequency signal for transmission, the modulation degree of said modulation means being controlled by said modulation signal; and (f) frequency synthesizer means for synthesizing a radio-frequency signal equivalent to the transmission frequency in order to provide said carrier; whereby uniform modulation throughout the frequency band of said modulation signal is achieved when the modulation signal level is relatively low; overmodulation is avoided while a sufficiently high mean amplitude modulated signal is maintained when the modulation signal amplitude is raised and the main frequency components of said modulation signal are distributed in an intermediate frequency range below 2.5 kHz; and the upper limit of the amplitude of said modulation signal is restricted to a moderately lower level when the main frequency components of said modulation signal are distributed in a higher frequency range over 2.5 kHz so that the level of produced spurious signals is reduced.

2. An amplitude modulation circuit according to claim 1 wherein said filter means includes a plurality of parallely arranged filters with different transfer frequency characteristics, at least one of said filters being selected to reduce the maximum gain at said higher frequency range.

3. An amplitude modulation circuit according to claim 1 or 6 wherein said filter means includes a high-pass filter.

4. An amplitude modulation circuit according to claim 1 or 6 wherein said filter means includes a band-rejection filter.

5. An amplitude modulation circuit according to claim 1 or 6 wherein said filter means includes a band-pass filter.

6. An amplitude modulation circuit for a transmitter, comprising:

a plurality of automatic level control circuits connected in series, each of said automatic level control circuits including: (a) gain controlled amplifier means for amplifying an input audio-frequency signal to produce a modulation signal, the amplification gain of said gain controlled amplifier means being negative-feedback-controlled by an automatic level control signal, (b) filter means for producing a filtered modulation signal from said modulation signal, the relative gain of said filter means in response to a signal having a first frequency being larger than the relative gain of said filter means in response to a signal having a second frequency lower than said first frequency, (c) rectifier means for rectifying the output signal of said filter circuit to provide a DC component proportional to the amplitude of said filtered modulation signal, and (d) eliminator means for eliminating ripples from the output signal of said rectifier means to provide said automatic level control signal converted into a direct current;

modulation means for amplitude modulating an input carrier to produce a modulated radio-frequency signal for transmission, the modulation degree of said modulation means being controlled by said modulation signal; and frequency synthesizer means for synthesizing a radio-frequency signal equivalent to the transmission frequency to provide said carrier; whereby uniform modulation throughout the frequency band of said modulation signal is achieved when the modulation signal level is relatively low; overmodulation is avoided while a sufficiently high means amplitude modulated signal is maintained when the modulation signal amplitude is raised and the main frequency components of said modulation signal are distributed in lower frequency range below said first frequency; and the upper limit of the amplitude of said modulation signal is restricted to a moderately lower level when the main frequency components of said modulation signal are distributed in higher frequency range over said first frequency so that the level of produced spurious signals is reduced.

7. An amplitude modulation circuit according to claim 1 or 6 wherein said filter means includes a plurality of filters connected in series.

* * * * *